(12) United States Patent
Aoyama

(10) Patent No.: US 6,281,097 B1
(45) Date of Patent: Aug. 28, 2001

(54) METHOD OF FABRICATING A SEMICONDUCTOR DEVICE HAVING EPITAXIAL LAYER

(75) Inventor: Tohru Aoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/295,582

(22) Filed: Apr. 22, 1999

Related U.S. Application Data

(62) Division of application No. 09/177,575, filed on Oct. 23, 1998, now abandoned.

(30) Foreign Application Priority Data

Oct. 24, 1997 (JP) ................................................ 9-291887

(51) Int. Cl.[7] ................................................... H01L 21/20
(52) U.S. Cl. .......................................... 438/478; 309/341
(58) Field of Search ..................................... 438/478, 483, 438/488, 341, 309, 933; 257/197, 592

(56) References Cited

U.S. PATENT DOCUMENTS 5,708,281   1/1998   Morishita .

FOREIGN PATENT DOCUMENTS 0566 112 A2   10/1993   (EP) .
0701 287 A2   3/1996   (EP) .

OTHER PUBLICATIONS

European Search Report dated Mar. 18, 1999.
Tatsumi, et al. "Selective epitaxial growth by UHV–CVD using Si2H6 and C12", May,2, 1992, Journal of Crystal Growth, vol. 120, No. 1/4, pp. 276–278.
Sato et al., "A Super Self–Aligned Selectively Grown SiGe Base (SSSB) Bipolar Transistor Fabricated by Cold–Wall Type UHV/CVD Technology", IEEE Transactions on Electron Devices, vol. 41, No. 8, Aug. 1, 1994, pp. 1373–1378.
Aoyama et al. "C12 Influence on Si1–xGex Base Epitaxial Layer Growth for High Speed Bipolar Transistor", International Conference on Solid State Devices and Materials, Sep. 1997, pp. 528–529, XP–000728224.

Korean Office Action dated Sep. 15, 2000, with partial translation.

*Primary Examiner*—Savitri Mulpuri
(74) *Attorney, Agent, or Firm*—McGinn & Gibb, PLLC

(57) ABSTRACT

There is provided a method of fabricating a semiconductor device, including the steps of forming an insulating film and an electrically conductive film on a silicon substrate, forming a first opening in the insulating film and a second opening in the electrically conductive film, the second opening having a smaller length than the first opening so that tunnel portions are formed in the insulating film below the electrically conductive film, and forming a $Si_{1-x}Ge_x$ base epitaxial layer on the silicon substrate in the first opening of the insulating film, wherein a process gas for growing the $Si_{1-x}Ge_x$ base epitaxial layer includes disilane, an etching gas includes chlorine, a ratio of the chlorine to the disilane is greater than 1/50, and a growth temperature is smaller than 640° C. In accordance with the method, it is possible to form a SiGe base epitaxial film having a greater thickness at opposite ends thereof than a thickness at the center thereof. Hence, even if the SiGe epitaxial film is formed to have a great thickness at opposite ends thereof for making electrical contact with the electrically conductive film, a central portion of the SiGe epitaxial layer acting as a base can have a small thickness. As a result, whereas a SiGe base epitaxial layer occupied about 80% of a thickness of an insulating film in a conventional semiconductor device, the SiGe base epitaxial layer formed in the above-mentioned method merely occupies about 60–3% of a thickness of the insulating film. Thus, the SiGe base epitaxial layer can be formed thinner, which ensures a higher operation rate of a bipolar transistor.

8 Claims, 4 Drawing Sheets

METHOD OF FABRICATING A SEMICONDUCTOR DEVICE HAVING EPITAXIAL LAYER

This application is a divisional of U.S. patent application Ser. No. 09/177,575, filed Oct. 23, 1998, now abandoned.

BACKGROUND OF THE INVENTION

1. Field of the Invention

The invention relates to a semiconductor device including a bipolar transistor having a SiGe base epitaxial layer, and further to a method of fabricating the same.

2. Description of the Related Art

In order to improve a high-frequency characteristic in a transistor, there has been suggested a self-aligned selectively grown SiGe base (SSSB) bipolar transistor including an epitaxial layer made of SiGe alloy as a base layer.

FIGS. 1A to 1C are cross-sectional views of a base region of such a SSSB bipolar transistor, illustrating respective steps of a method of fabricating the same. As illustrated in FIG. 1A, a silicon dioxide film 2 and a polysilicon film 3 are successively formed on a monocrystal silicon substrate 1 acting as a collector. Then, the polysilicon layer 3 acting as a base region is etched to thereby form a second opening 3a therethrough. Thereafter, a silicon nitride film 4 is formed over an exposed surface of the polysilicon layer 3, namely, an upper surface of the polysilicon layer 3 and an inner surface of the second opening 3a.

Then, the silicon dioxide film 2 is wet-etched through the second opening 3a to thereby remove a portion of the silicon dioxide film 2 at a base region. Thus, the silicon dioxide film is formed with a first opening 2a which is in connection with the second opening 3a. By wet-etching the silicon dioxide film 2, the silicon dioxide film 2 is side-etched, resulting in that tunnel portions 2b are formed around the first opening 2a.

Then, as illustrated in FIG. 1B, a SiGe epitaxial film 5 acting as a base layer is selectively grown on a surface of the monocrystal silicon substrate 1, exposed to the second and first openings 3a and 2a, and the tunnel portions 2b.

The growth of the SiGe epitaxial film 5 is discussed in F. Sato et al., "A Super Self-Aligned Selectively Grown SiGe Base (SSSB) Bipolar Transistor Fabricated by Cold-Wall Type UHV/CVD Technology", IEEE Transactions on Electron Devices, Vol. 41, No. 8, pp. 1373–1378, August 1994, for instance. In the suggested method, disilane and germanium are used as a process gas for growth, and chlorine is used as an etching gas for selective growth.

In addition, an influence of chlorine gas on SiGe epitaxial layer growth is discussed in T. Aoyama et al., "Cl$_2$ influence on Si$_{1-x}$Ge$_x$ base epitaxial layer growth for high speed bipolar transistor", Extended Abstracts of the 1997 International Conference on Solid State Devices and Materials, pp. 528–529.

Referring back to FIG. 1B, the SiGe epitaxial film 5 is formed by means of a cold-wall type UHV-CVD apparatus wherein a base pressure is equal to or smaller than $1.5 \times 10^{-9}$ Torr, disilane at 3 sccm and germanium at 2 sccm are used as a growth gas, chlorine at 0.03 sccm is used as an etching gas, and a growth temperature is set at 605 degrees centigrade.

Thus, the SiGe epitaxial layer 5 is formed on a surface of the monocrystal silicon substrate 1 in both the first opening 2a and the tunnel portions 2b. At the same time, a SiGe polysilicon film 6 is formed on a lower surface of the polysilicon film 3 exposed to the tunnel portions 2b.

Thus, the SiGe epitaxial film 5 grows upwardly, and the SiGe polysilicon film 6 grows downwardly both in the tunnel portions 2b until the SiGe films 5 and 6 come to contact with each other, as illustrated in FIG. 1C. Thus, a base layer consisting of the SiGe epitaxial film 5 makes electrical contact with the SiGe polysilicon film 6 making electrical contact with the polysilicon film 3 acting as a base electrode layer. Though not illustrated, an emitter layer and an emitter electrode are formed on a surface of the thus formed base layer 5 through the first opening 2a of the silicon dioxide film 2.

A bipolar transistor having such a structure as mentioned above can have a maximum cut-off frequency of 15 GHz.

In a conventional transistor as having been explained with reference to FIGS. 1A to 1C, since the SiGe epitaxial film 5 has a much greater growth rate than that of the SiGe polysilicon film 6, the SiGe epitaxial film 5 has a greater thickness than that of the SiGe polysilicon film 6 when they come to contact with each other, as illustrated in FIG. 1C. Hence, it is quite difficult or almost impossible to form the SiGe epitaxial film 5 to have a small thickness.

In particular, in accordance with the above-mentioned conventional method of epitaxial growth, the SiGe epitaxial film 5 occupies about 80% of a height of the tunnel portions 2b.

A time for electrons to run across a base layer can be made shorter, if the base layer has a smaller thickness. Namely, a base layer having a smaller thickness ensures a higher operation rate of a bipolar transistor. However, as mentioned so far, since it is quite difficult or almost impossible to form the SiGe epitaxial layer 5 thinner, there is paused a problem of difficulty in increasing an operation rate of a bipolar transistor by virtue of a thinner base layer.

In order to form the SiGe epitaxial layer or base layer 5 thinner, the silicon dioxide film 2 may be formed thinner to thereby decrease a height of the tunnel portions 2b. However, if the silicon dioxide film 2 is formed thinner, a parasitic capacitor formed between the monocrystal silicon substrate 1 acting as a collector and the polysilicon film or base electrode layer 3 would be increased. Thus, it would be necessary for the silicon dioxide film 2 to have a thickness of about 1000 angstroms at smallest. This means that the base layer 5 illustrated in FIGS. 1A to 1C would have a thickness of 800 angstroms at smallest, which prevents a bipolar transistor from operating at a higher rate.

SUMMARY OF THE INVENTION

In view of the foregoing problems of the conventional bipolar transistor, it is an object of the present invention to provide a semiconductor device including a bipolar transistor which has a thinner base layer, and a smaller parasitic capacitor, and is capable of operating at a higher rate without decreasing a thickness of an insulating film formed between a collector or a substrate and a base electrode layer. It is also an object of the present invention to provide a method of fabricating the same.

In one aspect of the present invention, there is provided a semiconductor device including (a) a silicon substrate, (b) a Si$_{1-x}$Ge$_x$ base epitaxial layer formed on the silicon substrate, (c) an insulating film formed on the silicon substrate, the Si$_{1-x}$Ge$_x$ base epitaxial layer making contact at opposite ends thereof with the insulating film, (d) a base electrode layer formed on the insulating film, the Si$_{1-x}$Ge$_x$ base epitaxial layer making electrical contact at the opposite ends and through an upper surface thereof with the base electrode layer, the Si$_{1-x}$Ge$_x$ base epitaxial layer having a greater thickness at the opposite ends thereof than a thickness at the central portion thereof.

It is preferable that the insulating film has a thickness equal to or greater than 1000 angstroms.

The semiconductor device may further include a heater for heating the silicon substrate.

For instance, X in the $Si_{1-x}Ge_x$ base epitaxial layer may be in the range of 0 to 15% both inclusive.

There is further provided a semiconductor device including (a) a silicon substrate, (b) an insulating film formed on the silicon substrate, and formed with a first opening, (c) a base electrode layer formed on the insulating film, and formed above the first opening with a second opening having a smaller length than the first opening so that tunnel portions are formed in the insulating film below the base electrode layer, and (d) a $Si_{1-x}Ge_x$ base epitaxial layer formed on the silicon substrate in the first opening of the insulating film, and having a greater thickness in the tunnel portions than a thickness below the second opening.

The semiconductor device may further include a second $Si_{1-x}Ge_x$ layer formed on a lower surface of the base electrode layer in the tunnel portions, the $Si_{1-x}Ge_x$ base epitaxial layer making electrical contact with the second $Si_{1-x}Ge_x$ layer in the tunnel portions.

For instance, the base electrode layer may be made of polysilicon.

In another aspect of the present invention, there is provided a method of fabricating a semiconductor device, including the steps of (a) forming an insulating film and an electrically conductive film on a silicon substrate, (b) forming a first opening in the insulating film and a second opening in the electrically conductive film, the second opening having a smaller length than the first opening so that tunnel portions are formed in the insulating film below the electrically conductive film, and (c) forming a $Si_{1-x}Ge_x$ base epitaxial layer on the silicon substrate in the first opening of the insulating film, wherein a process gas for growing the $Si_{1-x}Ge_x$ base epitaxial layer includes disilane, an etching gas includes chlorine, a ratio of the chlorine to the disilane is equal to or greater than 1/50, and a growth temperature is equal to or smaller than 640 degrees centigrade.

It is preferable that the step (c) is carried out by means of an ultra-high vacuum CVD apparatus. It is also preferable that the step (c) is carried out under a pressure equal to or smaller than $5\times10^{-3}$ Torr.

In accordance with the above-mentioned method, a SiGe epitaxial layer is formed as a base layer of a SSSB bipolar transistor by means of UHV-CVD wherein a ratio of disilane to chlorine is set equal to or greater than 1/50, and a growth temperature is set equal to or smaller than 640 degrees centigrade. A resultant SiGe base epitaxial film has a greater thickness at opposite ends thereof than a thickness at the center thereof. Hence, even if a SiGe base epitaxial film is formed to have a great thickness at opposite ends thereof for making electrical contact with a base electrode layer, a central portion of the SiGe epitaxial layer acting as a base can have a smaller thickness.

As a result, whereas a SiGe base epitaxial layer occupied about 80% of a thickness of an insulating film formed between a base electrode layer and a substrate in a conventional semiconductor device, the SiGe base epitaxial layer formed in accordance with the above-mentioned method merely occupies about 60–30% of a thickness of the insulating film. Thus, the SiGe base epitaxial layer can be formed thinner, which ensures a higher operation rate of a bipolar transistor.

It is also possible to increase a distance between a base electrode layer and a substrate, which ensures reduction in a parasitic capacitor to be formed therebetween, which in turn fascinates an operation of a bipolar transistor at a higher rate.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1A:
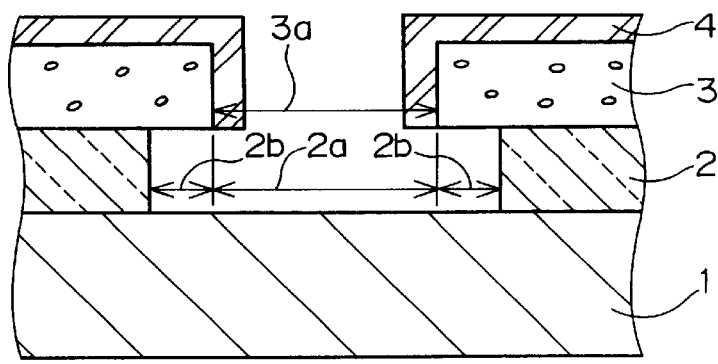
FIGS. 1A to 1C are cross-sectional views of a conventional bipolar transistor, illustrating respective steps of a method of fabricating the same.
Figure 1B:
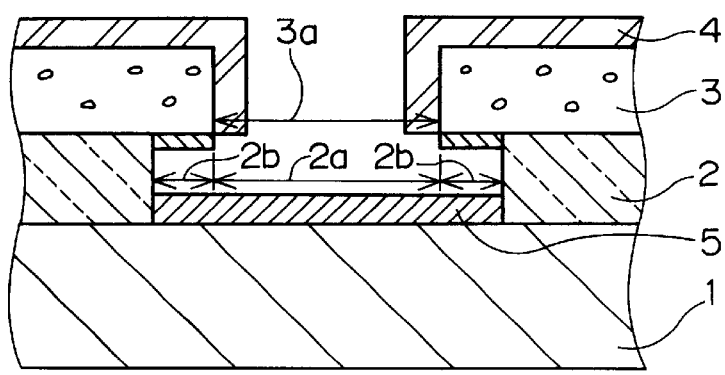
Figure 1C:
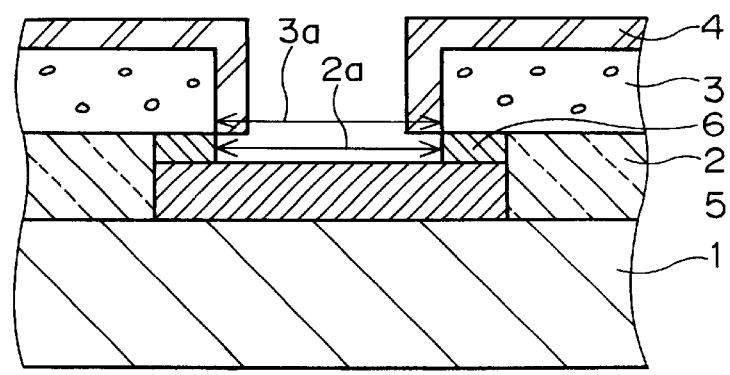
Figure 2:
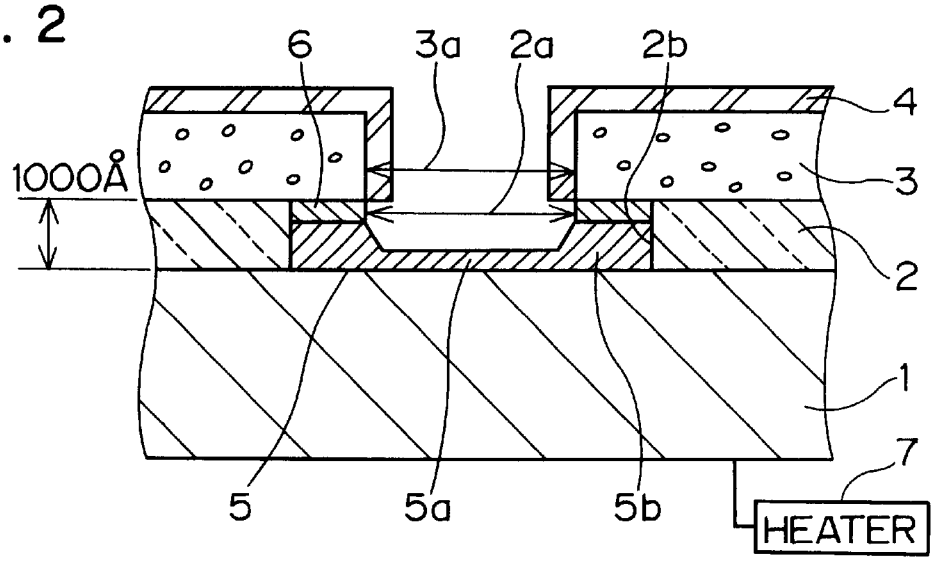
FIG. 2 is a cross-sectional view of a semiconductor device in accordance with the first embodiment of the present invention.

FIG. 2 illustrates a semiconductor device including a bipolar transistor in accordance with the first embodiment.

First, a silicon dioxide film 2 and a polysilicon film 3 are successively formed on a monocrystal silicon substrate 1 acting as a collector. Then, the polysilicon layer 3 acting as a base region is etched to thereby form a second opening 3a therethrough. Thereafter, a silicon nitride film 4 is formed over an exposed surface of the polysilicon layer 3, namely, an upper surface of the polysilicon layer 3 and an inner surface of the second opening 3a.

Then, the silicon dioxide film 2 is wet-etched through the second opening 3a to thereby remove a portion of the silicon dioxide film 2 below the second opening 3a. Thus, the silicon dioxide film is formed with a first opening 2a which is in connection with the second opening 3a. By wet-etching the silicon dioxide film 2, the silicon dioxide film 2 is side-etched, resulting in that tunnel portions 2b are formed around the first opening 2a.

Then, a SiGe epitaxial film 5 acting as a base layer is selectively grown on a surface of the monocrystal silicon substrate 1, exposed to the second and first openings 3a and 2a, and the tunnel portions 2b.

Thus, the SiGe epitaxial layer 5 is formed on a surface of the monocrystal silicon substrate 1 in both the first opening 2a and the tunnel portions 2b. At the same time, a SiGe polysilicon film 6 is formed on a lower surface of the polysilicon film 3 exposed to the tunnel portions 2b.

Thus, the SiGe epitaxial film 5 grows upwardly, and the SiGe polysilicon film 6 grows downwardly both in the tunnel portions 2b until the SiGe films 5 and 6 come to contact with each other, as illustrated in FIG. 2. Thus, a base layer consisting of the SiGe epitaxial film 5 makes electrical contact with the SiGe polysilicon film 6 making electrical contact with the polysilicon film 3 acting as a base electrode layer. Though not illustrated, an emitter layer and an emitter electrode are formed on a surface of the thus formed base layer 5 through the first opening 2a of the silicon dioxide film 2.

In the thus fabricated bipolar transistor in accordance with the first embodiment, the method in accordance with the present invention is applied to the growth of the SiGe epitaxial film 5. In the bipolar transistor illustrated in FIG. 2, the SiGe epitaxial film 5 is designed to have a greater thickness at opposite ends 5b located in the tunnel portions 2b than a thickness of a central portion 5a facing the second opening 3a. The SiGe epitaxial film 5 makes contact with the SiGe polysilicon film 6 at the opposite ends 5b thereof.

Since the SiGe epitaxial layer or base layer 5 is designed to have the thinner central portion 5a and the thicker opposite ends 5b, even if the SiGe epitaxial layer 5 makes contact with the base electrode layer 3 at the opposite ends 5b, a maximum cut-off frequency is enhanced from 15 GHz to 50 GHz due to the thinner central portion 5a of the SiGe epitaxial film 5.

Hereinbelow, a method of forming the SiGe epitaxial film 5 acting as a base layer of the bipolar transistor illustrated in FIG. 2 is explained.

In order to grow the SiGe epitaxial film 5, there was employed a coldwall type UHV-CVD apparatus. The SiGe epitaxial film 5 was formed under the following conditions:

Process gases for growth: disilane and germanium
Process gas for selective growth: chlorine
Concentration of germanium: 15%
Growth temperature: 640 degrees centigrade
Thickness of the silicon dioxide film 2: 1000 angstroms If a volume of the chlorine gas is set 0.2 sccm, the central portion 5a of the SiGe epitaxial film 5, which faces the first opening 2a, would have a thickness of 600 angstroms, whereas the opposite ends 5b of the SiGe epitaxial film 5, which are located in the tunnel portions 2b, would have a thickness of 900 angstroms. Hence, as the SiGe polysilicon film 6 grows from the polysilicon film 3, the base layer 5 could make contact with the base electrode layer 3 when the base layer 5 comes to have a thickness of 600 angstroms. Thus, it is possible to fabricate a bipolar transistor including the base layer 5 having the thin central portion 5a, specifically, which is 600 angstroms thick. As a result, a maximum cut-off frequency can be enhanced to 50 GHz from 15 GHz.

In the UHV-CVD apparatus, when a pressure is set equal to or smaller than $5 \times 10^{-3}$ Torr while the SiGe epitaxial film 5 is growing, molecules seldom collide with each other. Accordingly, molecules of disilane, chlorine, and others reach the monocrystal silicon substrate 1 without being decomposed. Then, the molecules collide with the monocrystal silicon substrate 1 which is at a higher temperature than the molecules, resulting in that the molecules decompose due to the collision. Herein, the decomposition of the molecules can be facilitated by heating the substrate 1 by means of a heater 7, as illustrated in FIG. 2.

In particular, since a space between the substrate 1 and the polysilicon film 3 is quite small in the tunnel portions 2b, the molecules collide with an inner wall of the tunnel portions 2b a lot of times. Since chlorine molecules have high reactivity, each time the chlorine molecules collide with substrate 1, the chlorine molecules react with other gases, and thus, consumed. As a result, the chlorine molecules cannot reach inside of the tunnel portions 2b.

Accordingly, even if chlorine gas is introduced into the UHV-CVD apparatus together with the process gases, the SiGe epitaxial film 5 grows in the tunnel portions 2b, as if the chlorine gas is not introduced. The chlorine gas introduced for selective growth may suppress a growth rate of the SiGe epitaxial film 5 in a certain condition. Hence, if the chlorine gas is introduced into the UHV-CVD apparatus so that a growth rate of the SiGe epitaxial film 5 is adequately lowered, the SiGe epitaxial film 5 would have a structure where the opposite ends 5b thereof located in the tunnel portions 2b have a greater thickness than a thickness of the central portion 5a exposed to the first opening 2a. This is because a growth rate is lowered of the SiGe epitaxial film 5 at the central portion 5a facing the first opening 2a, whereas a growth rate of the SiGe epitaxial film 5 at the opposite ends 5b located in the tunnel portions 2b is not lowered.

Figure 3:
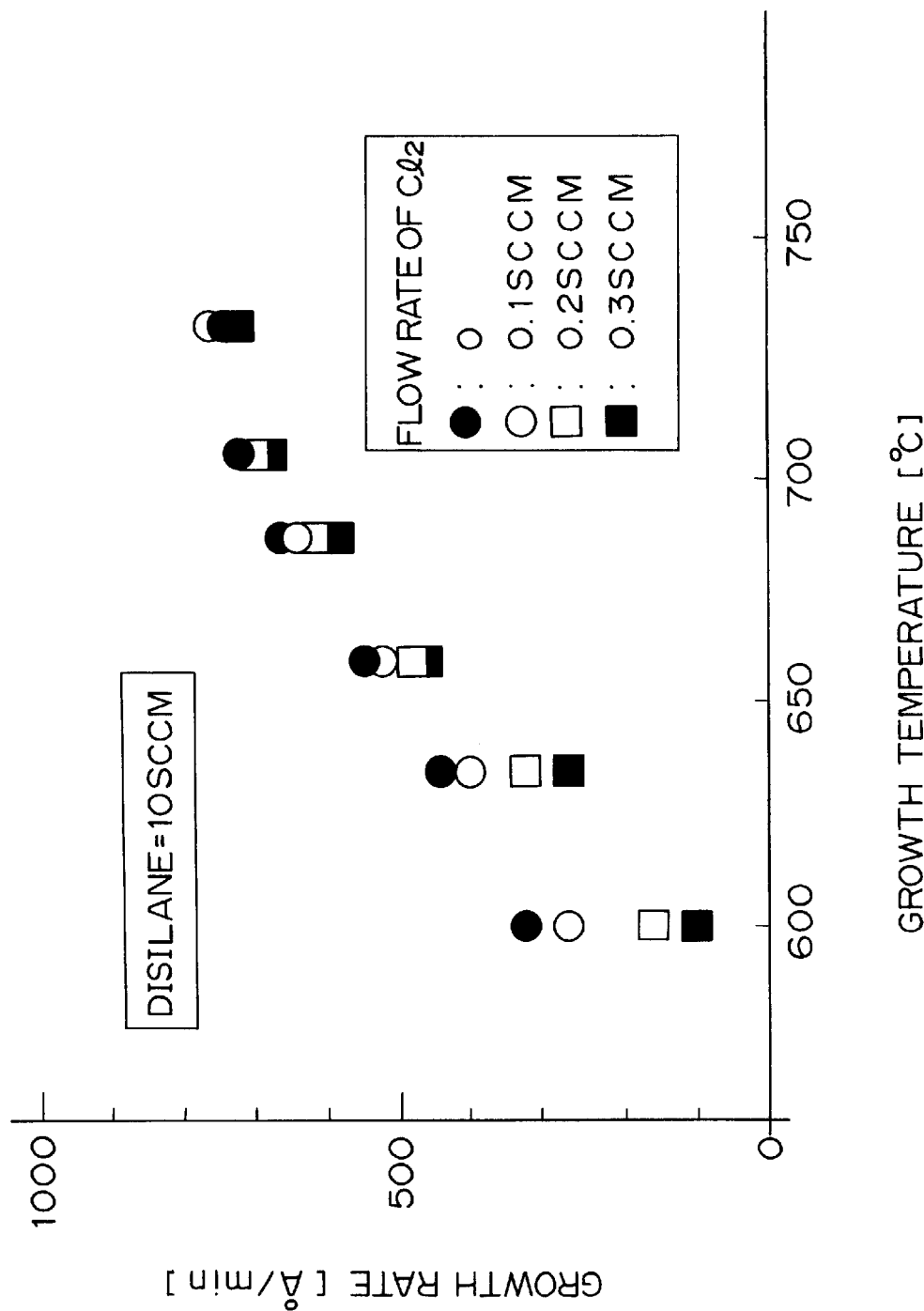
FIG. 3 is a graph showing a relation among a growth temperature, a growth rate, and an amount of chlorine in a SiGe epitaxial film in the semiconductor device illustrated in FIG. 2.

FIG. 3 illustrates a relation between a growth rate and a growth temperature of the SiGe epitaxial layer 5 including Ge at 15% for each of chlorine amounts. A flow rate of disilane is 10 sccm. As illustrated in FIG. 3, when a flow rate of chlorine is set 0.1 sccm wherein a flow rate ratio of disilane to chlorine is $1/100$, a growth rate remains unchanged in comparison with a growth rate obtained when no chlorine is added, even if a growth temperature is lowered down to 600 degrees centigrade.

On the other hand, when a flow rate of chlorine is set 0.2 sccm or greater wherein a flow rate ratio of disilane to chlorine is $1/50$ or greater, a growth rate is significantly lowered at a temperature equal to or smaller than 640 degrees centigrade, in comparison with a growth rate obtained when no chlorine is added. For instance, when a growth temperature is 640 degrees centigrade, and a flow rate of chlorine is set 0.2 sccm, a growth rate is lowered down to two-thirds of a growth rate obtained when no chlorine is added. The reduction in a growth rate is dependent on a concentration of germanium. Namely, the reduction in a growth rate is more significant at a lower concentration of germanium.

Figure 4:
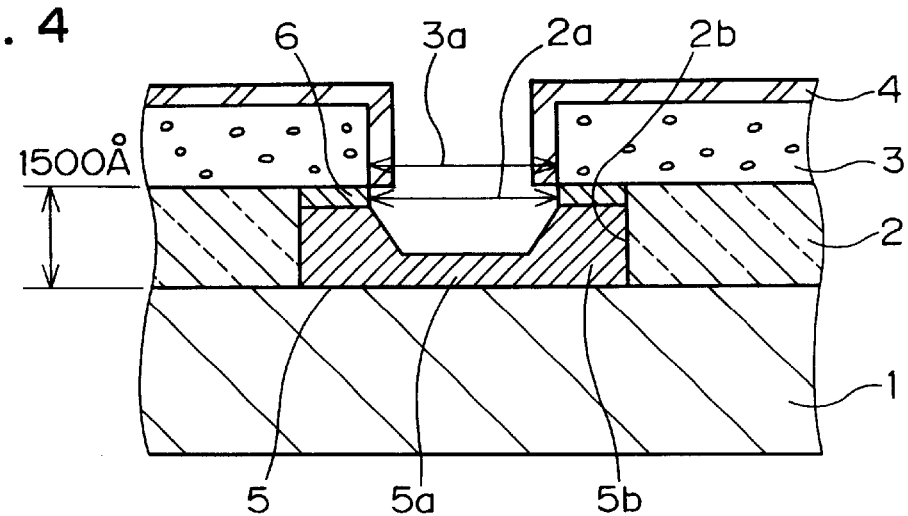
FIG. 4 is a cross-sectional view of a semiconductor device in accordance with the second embodiment of the present invention.

FIG. 4 illustrates a semiconductor device including a bipolar transistor in accordance with the second embodiment. Parts or elements that correspond to those of the bipolar transistor in accordance with the first embodiment illustrated in FIG. 2 have been provided with the same reference numerals.

In the second embodiment, there were employed the same UHV-CVD apparatus and process gases as those employed in the first embodiment. In the second embodiment, the silicon dioxide film 2 was designed to have a thickness of 1500 angstroms, which was greater than a thickness of the silicon dioxide film 2 in the first embodiment. The SiGe epitaxial layer or base layer 5 was formed by growing a SiGe epitaxial layer containing germanium at 12%, at a growth temperature of 600 degrees centigrade with a flow rate ratio of chlorine to disilane being equal to $3/100$.

In this embodiment, a growth rate was lowered to one-third of a growth rate obtained when chlorine is added. A growth rate at the opposite ends 5b of the SiGe epitaxial layer 5 in the tunnel portions 2b is three times greater than a growth rate at the central portion 5a of the SiGe epitaxial layer 5 facing the first opening 2a. That is, it was possible to cause the SiGe epitaxial layer 5 to have a reduced thickness of 500 angstroms at the central portion 5a facing the first opening 2a, whereas the SiGe epitaxial layer 5 had a thickness of 1500 angstroms at the opposite ends 5b located in the tunnel portions 2b.

In addition, it was possible to increase a space between the polysilicon film or base electrode layer 3 and the monocrystal silicon substrate or collector 1 up to 1500 angstroms from 1000 angstroms to thereby lower a capacitor between the collector 1 and the base layer 5, thereby it was possible to enhance a cut-off frequency up to 60 GHz from 15 GHz.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-291887 filed on Oct. 24, 1997 including specification, claims, drawings and summary is incorporated herein by reference in its entirety.

What is claimed is:

1. A method of fabricating a semiconductor device, comprising:

forming an insulating film on a silicon substrate;

forming an electrically conductive film on said insulating film;

forming a first opening in said insulating film and a second opening in said electrically conductive film, said second opening having a smaller length than said first opening so that tunnel portions are formed in said insulating film below said electrically conductive film; and forming a $Si_{1-x}Ge_x$ base epitaxial layer on said silicon substrate in said first opening of said insulating film, wherein said $Si_{1-x}Ge_x$ base epitaxial layer has a first thickness in said first opening and a second thickness, larger than said first thickness, in said tunnel portions wherein a process gas for growing said $Si_{1-x}Ge_x$ base epitaxial layer comprises disilane and an etching gas comprises chlorine, wherein a ratio of said chlorine to said disilane is equal to or greater than $1/50$, and a growth temperature is equal to or smaller than 640 degrees centigrade.

2. The method as set forth in claim 1, wherein said forming of said $Si_{1-x}Ge_x$ base epitaxial layer is carried out by an ultra-high vacuum CVD apparatus.

3. The method as set forth in claim 1, wherein said forming of said $Si_{1-x}Ge_x$ base epitaxial layer is carried out under a pressure equal to or smaller than $5 \times 10^{-3}$ Torr.

4. The method as set forth in claim 1, wherein X in said $Si_{1-x}Ge_x$ base epitaxial layer is in the range of 0 to 15% both inclusive.

5. The method as set forth in claim 1, further comprising heating said silicon substrate.

6. The method as set forth in claim 1, wherein said second thickness is equal to or greater than 1000 angstroms.

7. The method as set forth in claim 1, wherein said semiconductor device comprises a bipolar transistor having a maximum cut off frequency of at least 50 GHz.

8. The method as set forth in claim 1, wherein said first thickness is less than 80% of thickness of said insulating film.

* * * * *